(12) United States Patent
Savry et al.

(10) Patent No.: US 8,110,894 B2
(45) Date of Patent: Feb. 7, 2012

(54) PROTECTION FOR AN INTEGRATED CIRCUIT CHIP CONTAINING CONFIDENTIAL DATA

(75) Inventors: Olivier Savry, Grenoble (FR); Christophe Billard, Renage (FR)

(73) Assignee: Commissariat a l'Energie Atomique, Paris (FR)

( * ) Notice: Subject to any disclaimer, the term of this patent is extended or adjusted under 35 U.S.C. 154(b) by 869 days.

(21) Appl. No.: 10/583,377

(22) PCT Filed: Dec. 23, 2004

(86) PCT No.: PCT/FR2004/050756
§ 371 (c)(1),
(2), (4) Date: Jun. 19, 2006

(87) PCT Pub. No.: WO2005/069210
PCT Pub. Date: Jul. 28, 2005

(65) Prior Publication Data
US 2007/0121575 A1   May 31, 2007

(30) Foreign Application Priority Data
Dec. 29, 2003   (FR) ...................................... 03 51221

(51) Int. Cl.
*H01L 29/00* (2006.01)
(52) U.S. Cl. ......... 257/531; 257/295; 257/734; 370/351
(58) Field of Classification Search ........... 361/600–700
See application file for complete search history.

(56) References Cited

U.S. PATENT DOCUMENTS

| | | | |
|---|---|---|---|
| 4,795,898 A * | 1/1989 | Bernstein et al. | 235/487 |
| 4,933,898 A | 6/1990 | Gilberg et al. | |
| 5,760,456 A * | 6/1998 | Grzegorek et al. | 257/531 |
| 5,861,662 A | 1/1999 | Candelore | |
| 6,236,101 B1 * | 5/2001 | Erdeljac et al. | 257/531 |
| 6,246,970 B1 | 6/2001 | Silverbrook et al. | |
| 2002/0008428 A1 * | 1/2002 | Smola et al. | 307/413 |
| 2003/0081445 A1 * | 5/2003 | Van Brocklin et al. | 365/100 |
| 2004/0120101 A1 * | 6/2004 | Cohen et al. | 361/654 |

FOREIGN PATENT DOCUMENTS

| | | |
|---|---|---|
| CA | 2007469 | 8/1994 |
| DE | 197 38 990 | 3/1999 |
| EP | 0 874 401 | 10/1998 |
| JP | 2-232960 | 9/1990 |
| JP | 7-87237 | 9/1995 |
| JP | 10-294325 | 11/1998 |
| JP | 10-294444 | 11/1998 |
| JP | 2002-536727 | 10/2002 |
| WO | WO 00/45332 A1 | 8/2000 |

OTHER PUBLICATIONS

Koemmerling, Oliver et al.,"Design Principles for Tamper-Resistant Smartcard Processors", USENIX Workshop on Smartcard Technology, vol. 12, pp. 9-20, 1999.
Office Action issued Oct. 26, 2010, in Japan Patent Application No. 2006-546290 (English-language Translation only).

* cited by examiner

Primary Examiner — N Drew Richards
Assistant Examiner — Mamadou Diallo
(74) Attorney, Agent, or Firm — Oblon, Spivak, McClelland, Maier & Neustadt, L.L.P.

(57) ABSTRACT

An integrated circuit chip for holding or processing data on information for secure protection. A first side of the chip has at least one first conductor element and another side of the chip has another conducting element.

21 Claims, 6 Drawing Sheets

PROTECTION FOR AN INTEGRATED CIRCUIT CHIP CONTAINING CONFIDENTIAL DATA

TECHNICAL FIELD AND PRIOR ART

The present invention relates to the protection of electronic integrated circuits and relates more particularly to means for preventing access to security-sensitive content, such as confidential informative data, encryption or decoding codes, programs or secret data, or even simply property object data for protection, stored in the memory of integrated circuits.

The invention is aimed particularly at protecting integrated memory, microprocessor or microcontroller circuits (including application-specific integrated circuits or ASIC), which are used for example, in the fields of chip cards, electronic payment transactions, ticket dispensers, electronic purse devices, the field of pay per view television, audiovisual signal encryption/decoding, the field of mobile telephones, the field of secure access or identification systems such as medical smart cards and similar devices.

To access protected data in integrated circuits, unauthorised persons, known as "hackers", have a number of investigation methods at their disposal. Hackers generally start by unsealing the integrated circuit by removing the material of the cover of the component 2, as suggested in FIG. 2A, in order to access the substrate chip 20 of the integrated circuit itself.

The elements 21 of the integrated circuit which store, transmit and process the secret data are implanted on the upper surface of the substrate 20 which is coated with several successive layers of coating, such as substrate passivation, circuitry metal plating and insulation layers.

Hackers try to remove the coating layers by mechanical ablation, by etching, by acid dissolution, by laser scribing, by an attack of the type commonly known as DFA (or "Differential Fault Analysis") in order to access the circuit tracks and topography of the electronic circuit, so as to derive the data signals or break into the circuit operation.

Several methods may allow hackers to access the data. They can use microscopic contact probes to make a copy of the signals exchanged on the buses (possibly by drilling holes), or by using contactless electromagnetic probes or by using a confocal optical microscope device to reveal the electronic integrated circuit diagram, or by using a focused ion beam (FIB) workstation to very delicately strip off the coating materials, metal or insulator, and recompose the structure of the circuit (topography) with very high resolution.

Another method consists in using an improved scanning electron microscope (SEM) device, which reveals the electric potentials of the signals exchanged in the chips, the measurement being taken without contact through the chip.

At the present time, devices are known that are intended to protect the chip against tampering of this kind through the front surface.

Figure 1A:
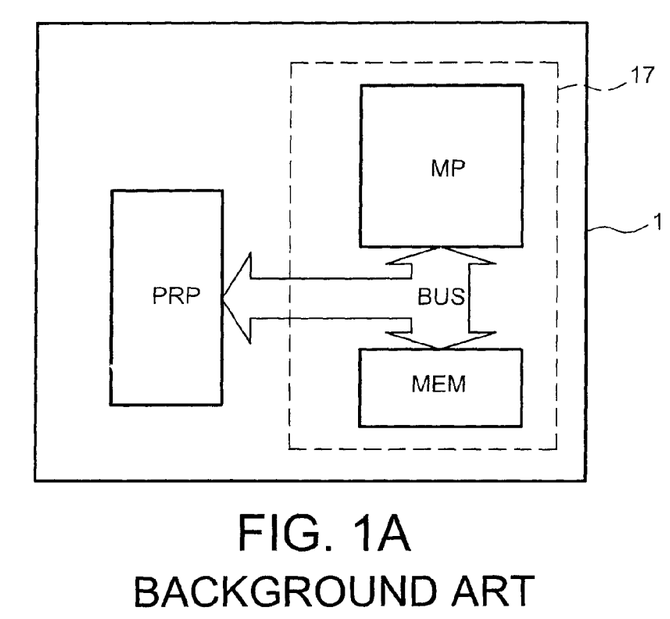
FIGS. 1A and 1B show, in a view from above and in cross-section, an integrated circuit chip with a front surface protection, in accordance with the prior art.

The document U.S. Pat. No. 4,933,898 describes an integrated circuit chip protected by a conductive protective shell arranged on the front surface of the chip, as shown diagrammatically in FIGS. 1A and 1B hereinafter appended.

Figure 1B:
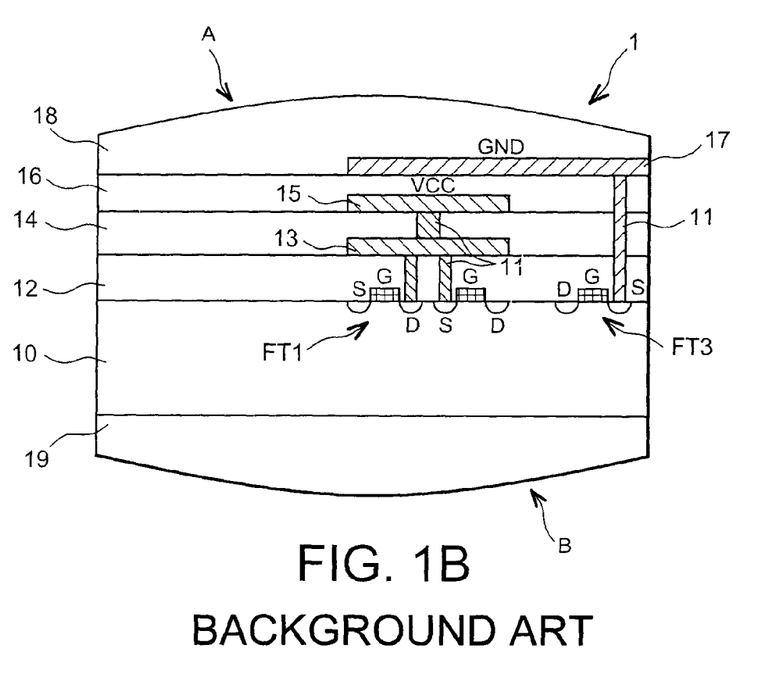

The cross-section view in FIG. 1B shows that the structure of the integrated circuit component 1 comprises metal plated planes 13, 15, 17 forming screens provided in upper layers 12, 14, 16 deposited on the substrate 10 of the integrated circuit 1.

According to the teaching in document U.S. Pat. No. 4,933, 898, these screens coat sensitive areas 17 corresponding to the MP, BUS, MEM transistor circuits FT1, . . . , FT3 which contain the data needing to be protected (MEM memory, BUS transmission bus, MP processing unit, for example). Each screen 13, 15 or 17 is connected, by means of plated-through holes 11 (via) passing through the upper layers 12-14-16 to the transistor circuits FT1, . . . , FT3 and carries a VCC or GND power supply signal necessary for these circuits to operate. The function of this metal shell is, on the one hand, to prevent an analysis by scanning electron microscope (SEM), X-ray or other electromagnetic means through the chip 1 and on the other hand, in the event of tampering or mechanical ablation of a conductive screen 17, 15 or 13 of this kind, to cause a disconnection of the power supply to the transistor circuits thereby automatically destroying the secret data.

The drawback of a device of this kind is that only the front surface is protected against tampering or attacks intended to break through the confidentiality of the stored data. The rear surface 19, B remains accessible to analysis or attack by a hacker seeking to access the protected data.

The document U.S. Pat. No. 5,861,662 describes another anti-hacking protection system for an integrated circuit 2, shown in FIGS. 2A and 2B appended.

Figure 2A:
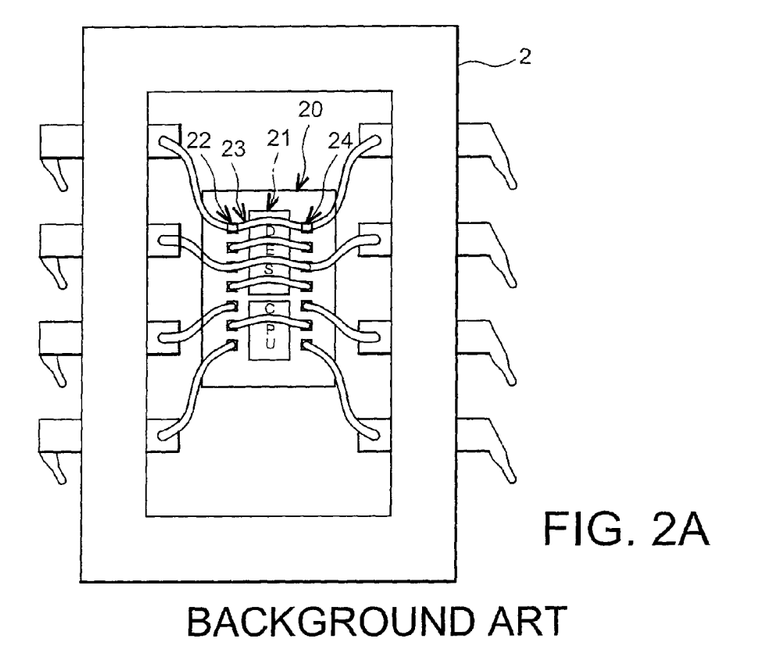
FIGS. 2A and 2B show, in a view from above and in cross-section, an integrated circuit chip that comprises guard wires on the front surface, in accordance with the prior art.
Figure 2B:
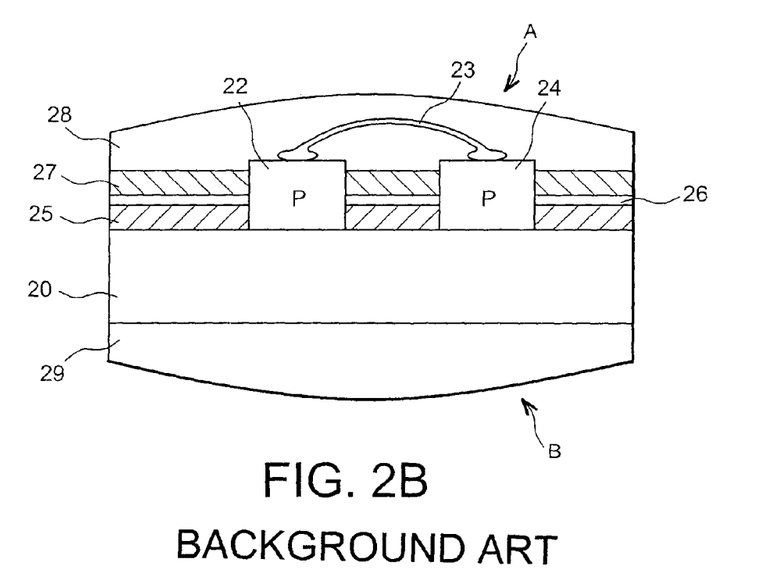

Wire bonds 23 extend over the protected circuits 21 processing the data for storage (such as a CPU processing unit, a DES data encryption standard peripheral circuit, a memory of the RAM, ROM type or the like). The wires 23 are embedded in the mass of encapsulation material 28, constituted by an epoxy layer 28, which coats the implantation zones of these sensitive electronic circuits 21. The wire bonds 23 transmit the signals required for these active circuits 21 to operate and are connected to said circuits 21 by means of contact points P constituted by plated-through holes 22, 24 (via) passing through the layers of vitrification 25, metal plating 26 and passivation 27 which successively coat the semiconductor substrate 20 and separate the chip from the coating material 28 inside the housing of the component 2.

The metal plating layer 26 integrated into the protective layers 25 to 27 coating the substrate 20 forms, here too, a screen against analysis by scanning electron microscope (SEM).

The chip 20 of the integrated circuit is then presented built into the encapsulation material which forms an upper epoxy layer 28 comprising the network of guard wires and an inert lower epoxy layer 29. The chip 20 is finally transferred into the external casing of the component 2 and connected to the connection pads/pins.

The drawback here is again that only the front surface A, in other words the upper side of the chip 20, is protected against tampering or attacks by hackers.

No protection is provided in respect of the rear surface 29-B.

The only generally adopted provisions in relation to the rear surface B of integrated circuit chips containing confidential data consist in totally enveloping the chip in an encapsulation material 29 which is difficult to remove. But hackers have the capacity to attack these encapsulation materials with ease. Indeed, hackers are now transferring their attacks to the rear surface subsequent to the measures that have been taken to protect the front surface by manufacturers of integrated circuits, particularly in respect of chip cards. The methods used by the hackers to attack the rear surface are conventionally DFA attacks, laser scribing, electromagnetic analysis in general, etc.

The communication from R. Anderson and M. Kuhn, entitled "Tamper resistant—a cautionary note", published in the "second USENIX Workshop on Electronic Commerce Proceedings" (page 1 to 11) in Nov. 1996, describes most of the currently known methods of attack used by hackers.

The drawback of known devices is that no protection is provided for the rear surface.

The subject matter of the invention is the implementation of integrated circuits that overcome the previous drawbacks.

One objective of the invention is to provide protection for the rear surface of integrated circuit chips in respect of which security is a sensitive matter.

Another objective of the invention is the general improvement of protection for an integrated circuit containing secret data, both on the rear surface and on the front surface.

The particular objective is to protect an integrated circuit containing sensitive data against any kind of attack by hackers on the two opposite surfaces of the chip, such as laser attacks, contactless electromagnetic inspections, analyses by scanning electron microscope (SEM), or with confocal microscopes, DFA attacks, tampering by mechanical or chemical stripping, tampering by microprobes, chemical analyses (with crystal or ion developers), structural resolution using a focused ion beam (FIB) device, etc.

Another objective is to obtain an integrated circuit with comprehensive surface protection that is easy to implement, and in particular does not involve the fabrication of via through the entire thickness of the chip.

DESCRIPTION OF THE INVENTION

These objectives are met by providing, in accordance with the invention, an integrated circuit containing fully protected sensitive data comprising a first conductive element arranged on the upper side or on a first surface, for example the front surface of the integrated circuit chip and forming a surface inductance, associated with another metallic or conductive element generally arranged on the lower side or on a second surface, for example the rear surface of the chip, this other surface element modifying the field and/or the value of the inductance, such that any variation in the inductance caused by an attack and/or a hit, and/or tampering with the rear surface inductive element or an attack (hit/tampering) on the inductance itself on the front surface is detected by the integrated circuit, which has means to trigger countermeasures, such as the deletion of the encoded information or data stored in the memory.

The protective device according to the invention may be formed simply of a metal plated inductance spiral or coil, deposited on or in a surface plane, on the upper side of the chip and coupled with a metal plated plane arranged on or under the rear surface on the lower side of the chip, this plane being able to form for example an electromagnetic reflector.

Provision is made for the conductive element of the inductance to be connected to the tracks and transistors of the electronic circuit, from which it is separated by a passivation layer by means of plated-through holes (via) passing through this passivation.

Conversely, since the rear surface conductive element is coupled without contact to the front surface inductance, it is not necessary to connect it to the integrated circuit of the chip, and the rear surface does not comprise any connection via. Indeed, the invention makes it possible advantageously to avoid providing a plated-through hole (via) through the thickness of the semiconductor substrate, which would cause a problem technically.

In this way, advantageously, the rear surface of the chip is protected without providing a plated-through hole through the substrate chip. Full side metal plating of the rear surface is sufficient to perfect the protection of the chip on the rear surface.

The invention implements an electronic device that includes an integrated circuit chip intended to contain, in particular to store, memorise, transmit or process, informative data needing secure protection, such as secret data, encryption or decoding data, wherein a first side of the chip comprises. at least one first conductive element and in that another side of the chip comprises another conductive element.

The first conductive element and the other conductive element may be coupled.

According to one embodiment, the first side of the chip may comprise, additionally, a second conductive element arranged in proximity to the first conductive element.

According to the invention, the first conductive element and/or the second conductive element may comprise an inductance, whereas the other conductive element may form a low resistance earth plane and/or comprise a conductance.

According to the invention, the integrated electronic circuit on or in the chip may comprise means for the electromagnetic excitation of the first conductive element.

Provision may also be made for the integrated electronic circuit to comprise means for measuring the inductance of at least one of the conductive elements.

The integrated circuit may further comprise means for detecting a change in the value of at least one electrical parameter of the conductive element or elements, particularly a change in the inductance or resistance value of the first and/or second conductive element.

And, provision may be made for the integrated circuit to comprise means for deleting or ceasing to store the informative data in the event of a change in the value of an electrical parameter being detected.

Advantageously, the first conductive element and/or the second conductive element may be connected to the integrated electronic circuit of the chip by means of at least and/or at least one connection also known as a "via" passing through one or more coating layers coating the first side of the chip, whereas the other side does not comprise any via or connection.

Lastly, the conductive elements of the chip are coated with an encapsulation material.

The invention may be implemented particularly in a chip card that includes at least one such integrated circuit chip electronic device.

The invention may also apply to an encryption or decoding device that includes one or more such integrated circuit chip electronic devices.

BRIEF DESCRIPTION OF THE DRAWINGS

Other objectives, characteristics and advantages of the invention will emerge from reading the detailed description given hereinafter of embodiments of the invention, given as non-restrictive examples, with reference to the appended drawings in which.

DETAILED DESCRIPTION OF EMBODIMENTS OF THE INVENTION

Figure 3A:
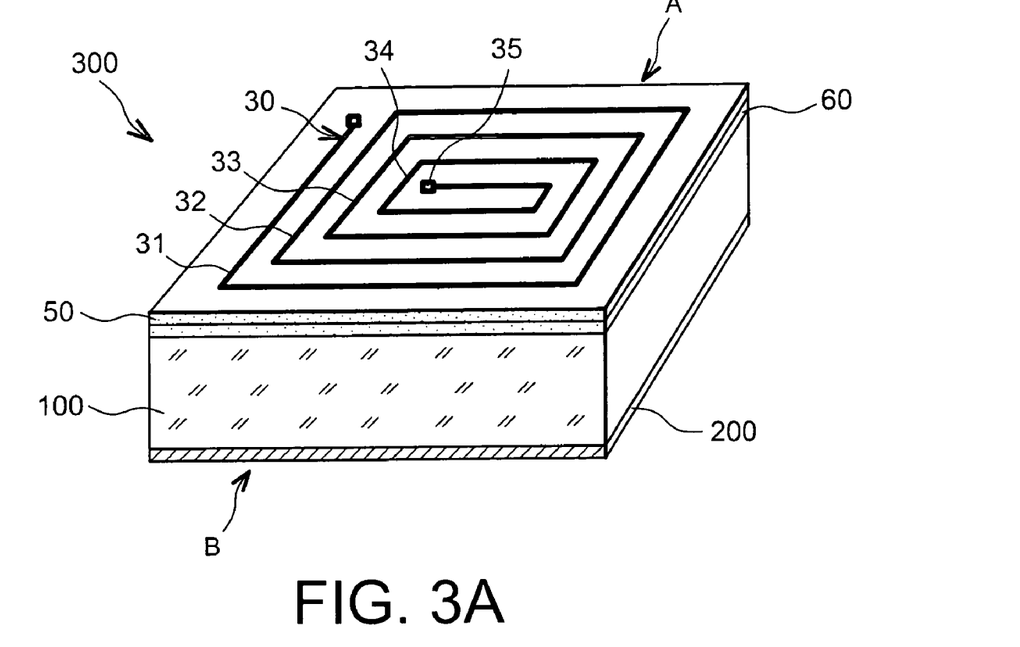
FIGS. 3A and 3B show, in a view from above and in cross-section, an integrated circuit chip with conductive front surface and rear surface protective elements, according to the invention.
Figure 3B:
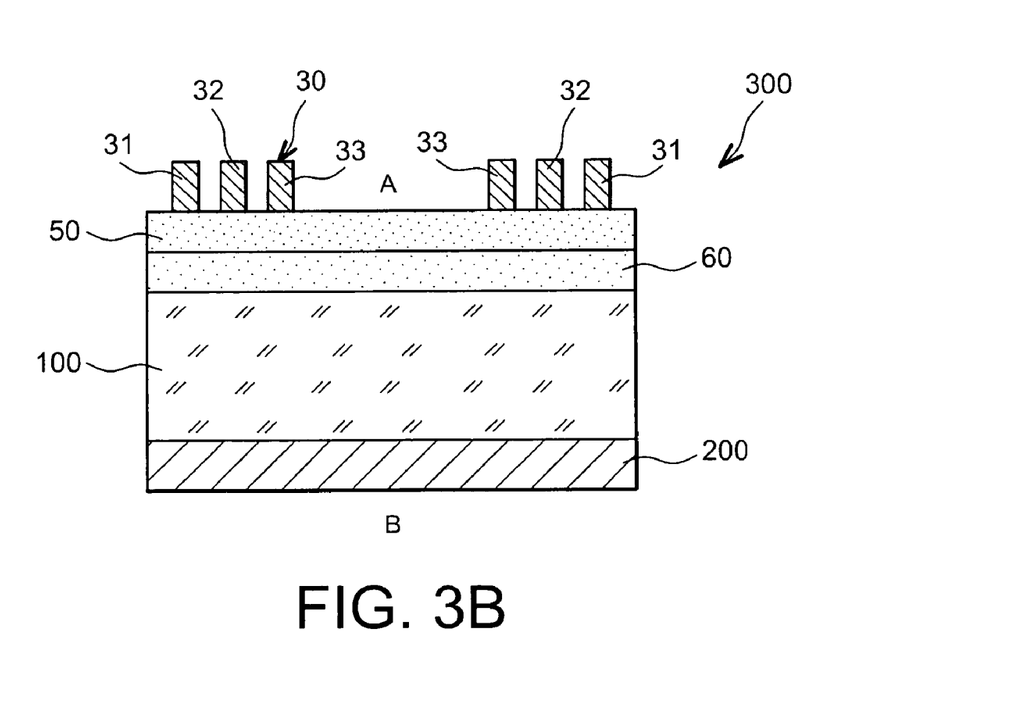

FIGS. 3A and 3B show in diagrammatic form a first embodiment of a protected integrated circuit 300 which illustrates the principle of the invention.

In the figures, the integrated circuit chip 300 is shown bare, in a stripped down form, away from any encapsulation or coating material and without a connection pad, elements which can constitute external elements of the housing of a finished electronic component.

The core of the integrated circuit 300 is formed of a substrate chip 100 into which are implanted the electronic circuit components, such as transistors, diodes, resistors, capacitors etc., which are not shown here.

The chip 300 is constituted by a small piece of semiconductor material generally parallelepiped and of miniature dimensions (of the order from a few micrometers to several tens of millimeters, or even more, typically between about a hundred micrometers and several micrometers, generally a micrometer fraction or a few micrometers, for example: 0,25 microns or 1,3 microns of side for 0,15 microns of thickness approximately).

According to the invention, the integrated circuit chip 300 comprises a first conductive element 30 arranged on or in the upper side of the chip 300 that corresponds to the front surface A, for example on a first passivation layer 50, itself able to lie on a second passivation layer 60. The chip comprises on the other hand another conductive element 200 arranged on the rear surface B, the lower side of the chip 300.

In this configuration, the arrangement of the conductive elements on the opposing surfaces A and B of the chip 300 makes it possible to obtain an inductive or electromagnetic coupling between the first conductive element 30 and the other conductive element 200.

According to the embodiment in FIG. 3A, the first conductive element 30 comprises a spiral inductive winding with several turns 31, 32, 33, 34 and forms a sort of self coil or inductance coil. According to the diagram 3A, the other conductive element 200 is formed of a metal plane deposited on the rear surface B of the chip 300. In FIG. 3B only 3 turns 31, 32, 33 are shown.

In the configuration in FIG. 3A, the other conductive element 200 is deposited a small distance away from the first conductive element 30 and in the axis or at least near the axis A-B of the turns of the inductive coil formed by the first element 30, such that the other conductive element 200 is found geometrically in the field of the first element 30.

Interposing the other conductive element 200 in the field of the inductance coil of the first conductive element 30 modifies the inductance value of this first element 30.

Such an arrangement is advantageous in protecting the rear surface B of the integrated circuit 300. It confers several levels of protection.

On the one hand, the rear surface conductive element 200 offers passive protection. Metal plating the rear surface forms a mechanical barrier and a screen against electromagnetic waves and particles.

In this way, the rear surface conductive element 200 protects against mechanical tampering and prevents an electromagnetic probe being available to pick up contactless signals.

The element 200 forms, additionally, a screen against X-rays and against an electron beam from a scanning electron microscope (SEM).

The rear surface conductive element 200 thereby offers passive protection against attacks from hackers who are trying to gain access to secret data by means of display or investigation means of this kind.

The invention allows on the other hand active protection in the event of an attempt to evade totally or in part the metal plating 200 of the rear surface B.

Indeed, since the inductance of the first conductive element 30 is modified by interposing the other conductive element 200 in its field, the consequence of the ablation of this other element 200 will be to vary the value of the inductance of the first element 30.

Figure 6A:
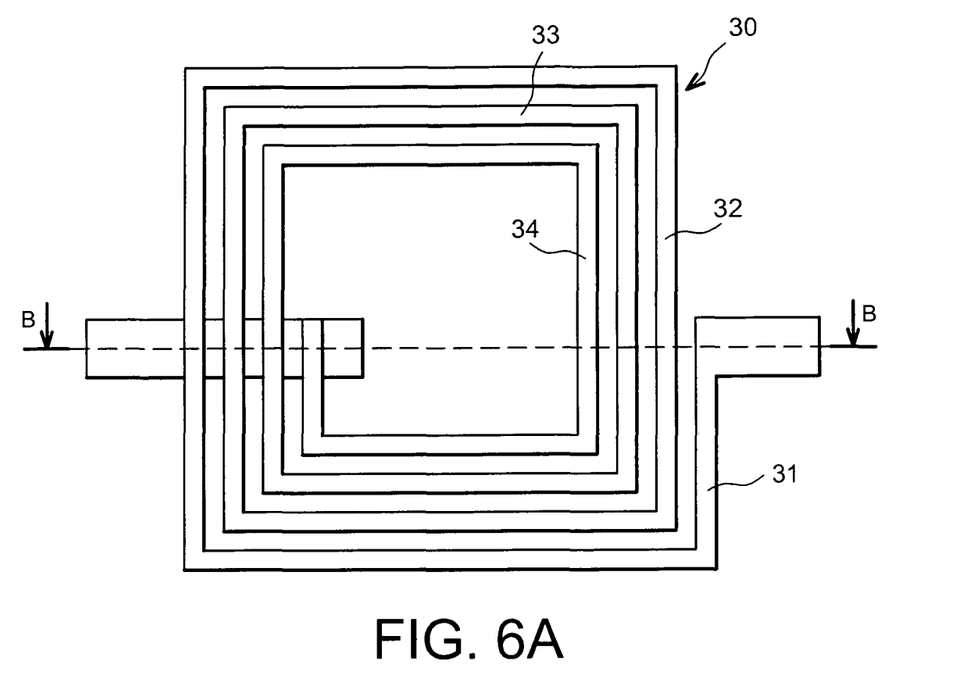
FIGS. 6A and 6B show an embodiment of a conductive winding on an integrated circuit chip, according to the invention.
Figure 6B:
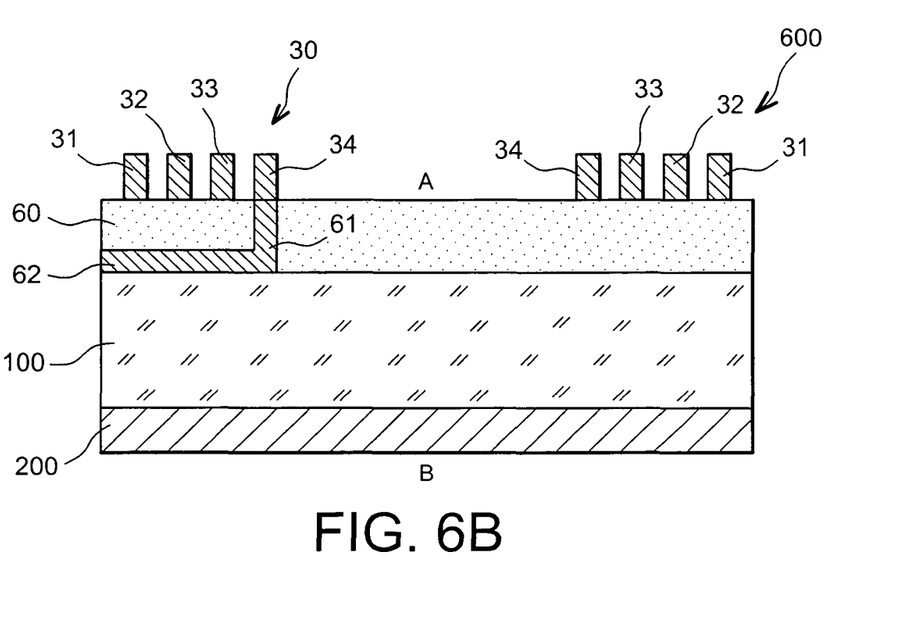

In this way, in accordance with the embodiment example in FIGS. 6A and 6B, by depositing a structure formed of a coating layer 60 of silicon oxide or dioxide on which is implanted a ten micrometer wide (10 µm) copper track 30 wound in the form of a greek-key pattern or square spiral with four turns 31, 32, 33, 34 and by depositing a five micrometer thick (5 µm) earth plane metal plating 200 in aluminium on the other side B of a square chip 100 with a side of two hundred and fifty micrometers (250 µm) and a thickness of one hundred and fifty micrometers (150 µm) on a silicon substrate (semiconductor of resistivity of fifteen ohms centimeters) a variation in the inductance value is obtained of the order of one tenth (about 10%) in the event of ablation of the metal plated plane 200 on the rear surface B. The reference 61 denotes a via and the reference 62 a metal plating layer.

The chip has a size or a surface of approximately between 3×3 mm$^2$ and 5×5 mm$^2$.

A range as mentioned above is sufficient for the electronic circuit to be able to detect tampering and to trigger measures against hacking consisting for example in deleting the confidential data or in blocking access thereto in read mode.

Consequently, the invention provides active protection means consisting in measuring, constantly or intermittently, the inductance value of the first front surface conductive element 30.

To advantage, the invention makes it possible to verify the integrity of the rear surface protective device 200 by means of the first front surface conductive element 30, and to do so remotely and without contact with the rear surface conductive element 200.

The invention further makes it possible to protect the front surface A against attacks from hackers by means of the first element 30 arranged on the upper side A of the chip.

An attempt at ablation of part. or all of the passivation layers 50, 60 coating the substrate 100 and the integrated electronic circuit will end in the ablation or short-circuiting of the turns of the first conductive element 30, and therefore in the detection of the disappearance of or any variation in the inductance. On the other hand, an attempt at tampering consisting in inserting a microprobe to make a copy of the signals being exchanged on the integrated circuit 300 connection tracks will end in the disconnection or short-circuiting of the tracks 31, 32, 33, 34 of the conductive element 30, which modifies the inductance or resistance value, or more generally the impedance of the first conductive element 30.

Additionally, according to another embodiment of the invention, provision is made to improve protection by providing a second conductive element 40 in proximity to the first conductive element 30 on the front surface A, on the surface or inside (under the surface) of the first side of the chip.

Figure 4:
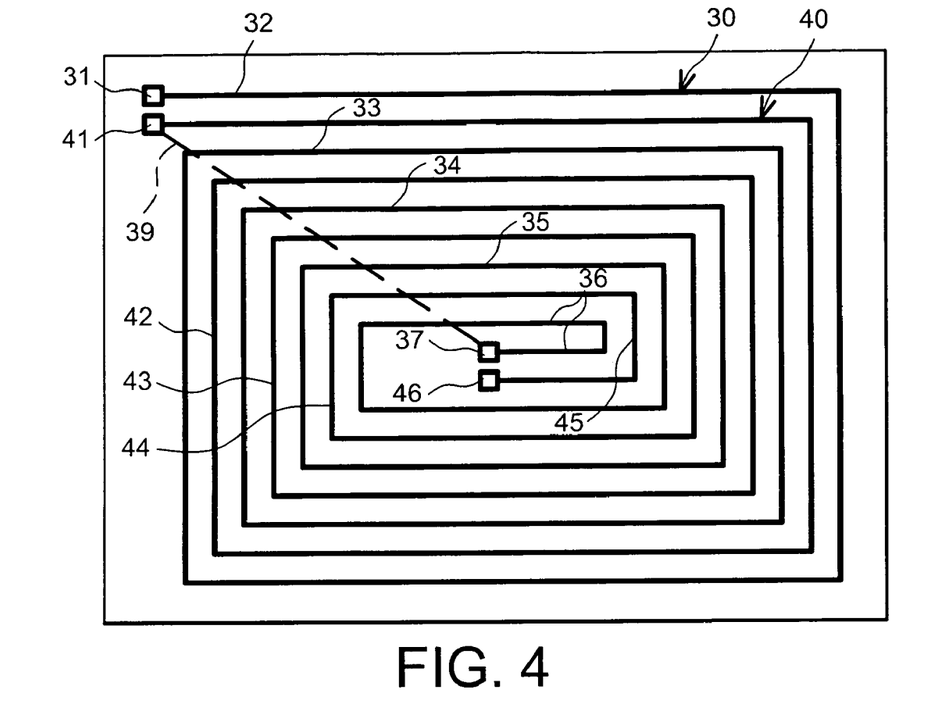
FIG. 4 shows a view from above of the implantation of two conductive elements on the front surface of an integrated circuit chip according to the invention.

FIG. 4 shows in diagrammatic form the implantation of two conductive elements 30, 40, on the upper side of an integrated circuit chip, according to this other embodiment of the invention.

In the embodiment example given in FIG. 4, the first and second conductive elements 30, 40 are constituted by two inductance coils formed by two windings of metal tracks arranged in a spiral alternately and embedded one in the other.

To advantage, the two windings 30 and 40 are connected in series by an underlying junction 39, such as a "bridge" or "underpass" such that their inductances are added together.

In this way, any attempt at tampering leading to the disconnection of a self-inductance track 32-36, 41-44 or a short-circuit between the two conductive elements 30 and 40, translates into a modification of the overall inductance value of the conductive elements. The inductance value of all the elements 30 and 40 in series between the connections 31 and 46 have therefore only to be measured constantly or at intervals of time (regular or irregular), in order to detect any tampering with the integrated circuit.

According to the invention, the integrated circuit therefore comprises internal electronic circuits constituting means for the electromagnetic excitation of the first conductive element 30, means for measuring the inductance of the conductive unit 30/40, and means for detecting a change in the value of the inductance.

In the event of a change being detected in the value of an electrical parameter, signifying that the protective device has been breached, the integrated circuit activates protective measures against the intrusion consisting for example in deleting the secret data, in blocking the operation of the circuit or in preventing a data transmission, notably at output.

Inductance excitation means may be means that generate a sinusoidal current applied to the inductance.

It is then possible to choose to re-measure a variation in the phase or amplitude of this sinusoid, between the voltage at the terminals and the injected current and to do so by using means for the measurement of variation, and phase or amplitude respectively.

It is also possible to measure the resonant frequency of a circuit constituted by the inductance coupled with one or more components of R type and/or C type that have known values. In this case, resonance measurement, or frequency measurement means are implemented.

Inductance excitation means may also be means for generating a rectangular signal that attacks a circuit constituted by the inductance, in series or in parallel with a preset resistance.

It is then possible to measure, with appropriate means, a variation in the rise time, or fall time, of the signal.

In all cases, the measured signal may be presented in the form of a voltage dependent on the inductance. Attempts are then made to compare this voltage, an image of the inductance, with a stored voltage which acts as a benchmark. Storage of this kind in the circuit may be effectuated, in storage means, in analogue form (for example by storing in a capacitance) or digital form (the reference being stored in a ROM memory in binary format, and converted by a DAC into an analogue voltage).

The measurement and the value stored can then be compared by using voltage comparator means.

If these two values are too different, counter measures can be applied, consisting for example in stopping the power supply to the chip (for example by a transistor between. the earth and the VCC), or deleting the memory (several techniques are conceivable depending on the type of memory used), or blocking a vital element of the microprocessor (for example access to the battery, or to the register, etc).

Figure 5:
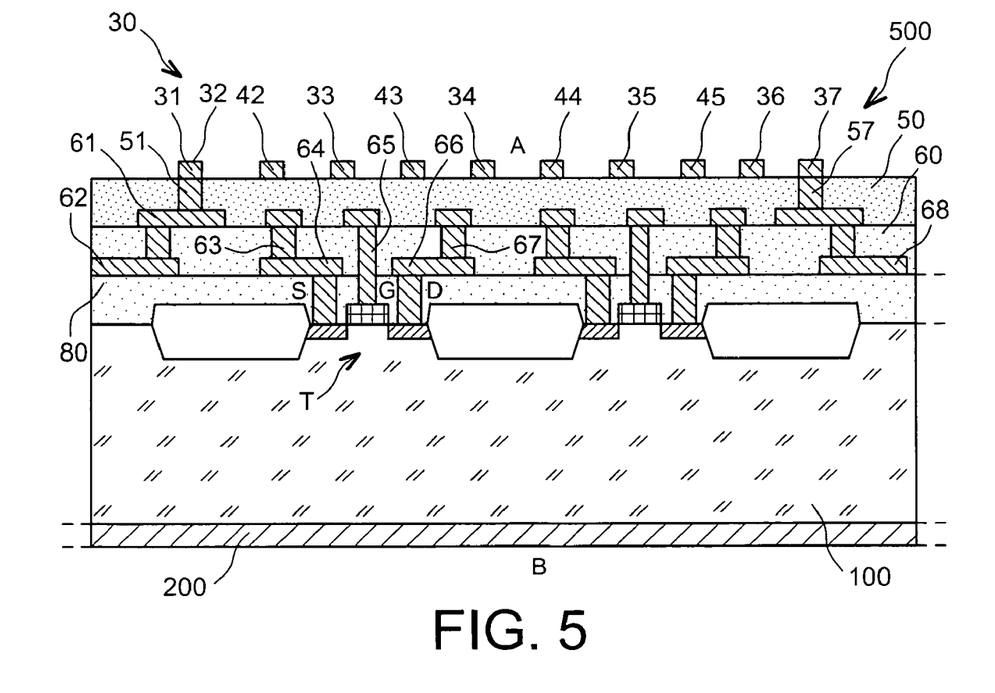
FIG. 5 shows a view in cross-section of levels of interconnection between the front surface conductive elements and the integrated circuit chip, according to the invention.

As shown in FIG. 5, provision is made for the internal electronic circuits of the chip 500 to be connected to the first conductive element 30 and, where appropriate, to the second conductive element 40, so as to apply an induction current in the inductance coil 30 in order to obtain electromagnetic excitation and so as to take electrical measurements at the terminals of the conductive elements 30 and 40.

FIG. 5 shows a cross-section view of one embodiment of an integrated circuit chip 500 which shows a mode of connection between the conductive elements 30 and 40 arranged over the successive insulation/metal plating/passivation layers of the integrated circuit chip (supra-chip conductive elements) and the internal electronic circuits of the chip 500. The internal circuits of the integrated circuit chip (not shown in detail) contain the means for the electromagnetic excitation of the first conductive element 30, the means for measuring electrical parameters of the first and/or second conductive element 30/40 and possibly means for detecting change in the electrical parameter value.

To advantage, provision is made for the first conductive element 30 to be connected to the internal electronic circuit for the excitation and measurement of electrical parameters, by means of at least one via, in other words a hole provided through the passivation/insulation layers 50/60/80 and filled with a metal deposition in order to bring the electrical contact to the surface.

The example shown in diagrammatic form in FIG. 5 therefore shows that control transistors T able to deliver a switched or alternating excitation signal to the inductance coil 30 may be connected to end connection ranges 31 and 37 of the first conductive element 30 by means of several successive levels of metal plating 62-52, 68-58 and of interconnection via 61-51, 69-57 provided in the thickness of the coating layers 50-60-80 deposited above the substrate 100 of the integrated circuit of the chip 500.

Initially, the substrate comprises for example areas for the diffusion or ion implantation of doping elements forming MOSFET type field effect transistor channels separated by FOX type oxide insulation enclosures.

Each transistor T comprises source S, gate G and drain D contact metal plating, all these elements being coated with a passivation layer 80.

Each contact terminal S, G, D is surmounted by a via, in other words a plated-through hole passing through the thickness of the passivation layer 80, in order to bring the contact to the surface of the passivation.

A metal plating layer 62-64-66-68 is deposited and etched on the passivation layer 80 to form metal plated tracks, embodying the topography of the electronic circuit itself, in other words paths of the interconnection. circuit between the contact terminals of the transistors T and those of the other elements making up the circuit.

This level of metal plated interconnection tracks 62-64-66-68 is coated with a layer 60 of additional insulant coating in order to insulate and protect the circuit tracks.

According to the embodiment in FIG. 5, vias 61, 63, 65, 67, 69 are provided through this layer 60 in order to bring the contact of the control terminals S, G, D into connection with the terminals 31 and 37 of the conductive elements 30 and 40.

Another stage comprising a level of metal plated tracks 52-58 coated with a coating layer 50. may also be provided over this structure with stages 60/80 in order to implement one or more interconnections between the terminals 31-37 and 41-46 of the inductance coils formed by the first and second conductive elements 30 and 40.

As shown in diagrammatic form in FIG. 4, such an arrangement is advantageous in allowing the spiral winding of the first conductive element 30 to be connected in series with the spiral winding of the second conductive element 40, by means of an interconnection 39 or an underlying junction provided inside the layer 50 on which the metal tracks 31 to 37 and 41 to 46 of the conductive elements 30 and 40 are themselves deposited.

Since an interconnection of this type, also known as an "underpass", comprises at least one first via 57 (69), an underlying conductive track 39 (or 58-69-68- . . . -62-61-52) and at least one second via 51 (61), allows the final end 37 of the first conductive winding 30 to be connected in series to the initial end 41 of the other conductive winding 40. The two windings 30 and 40 embedded one in the other may thus to advantage be connected in series without reversing the direction of rotation of the induction current.

Vias and interconnection levels of this kind on the other hand allow the terminals 31, 41, 37, 46 of the conductive elements to be connected to the internal electronic circuit of the chip, in particular to the terminals of the excitation means and electrical parameter measurement means.

According to the embodiment process provided by the invention, the first conductive element and/or the second conductive element are implanted by metal plating deposition and etching on the first side of the chip, the deposition of the metal plating on the first and/or second conductive element being preceded by passivation, metal plating and etching layer deposition stages in order to form at least one intermediate interconnection conductive level between the integrated electronic circuit and the conductive element or elements.

The embodiment process further provides for the other conductive element to be formed by metal plating deposition on the other side of the chip.

Figure 7A:
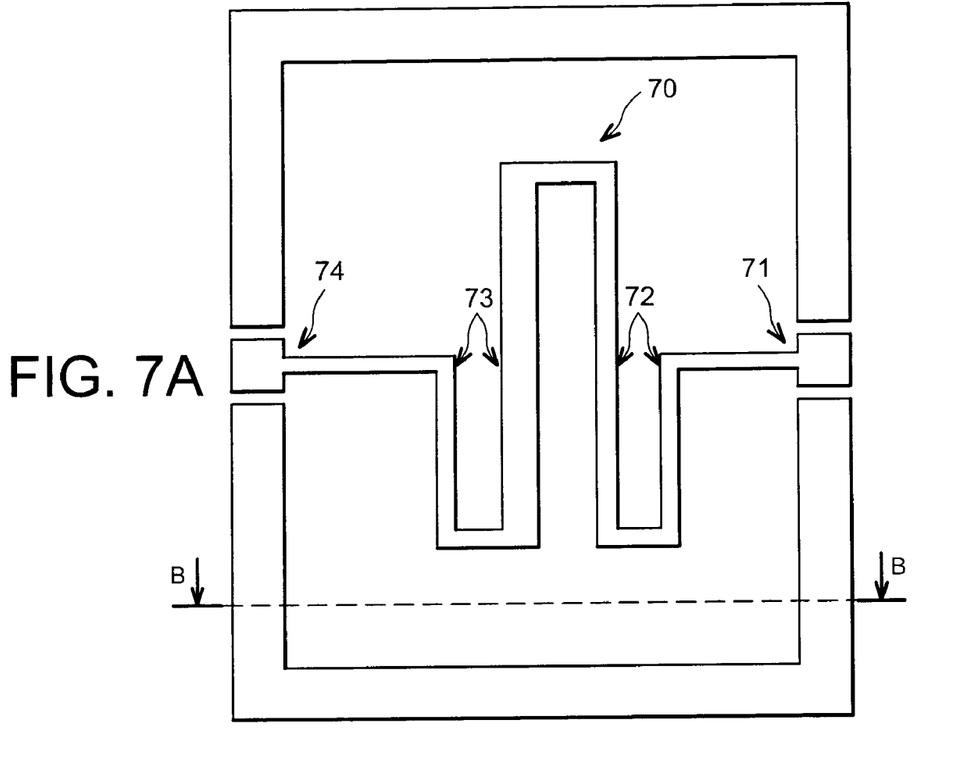
FIGS. 7A and 7B show another embodiment of a conductive element on an integrated circuit chip, according to the invention.
Figure 7B:
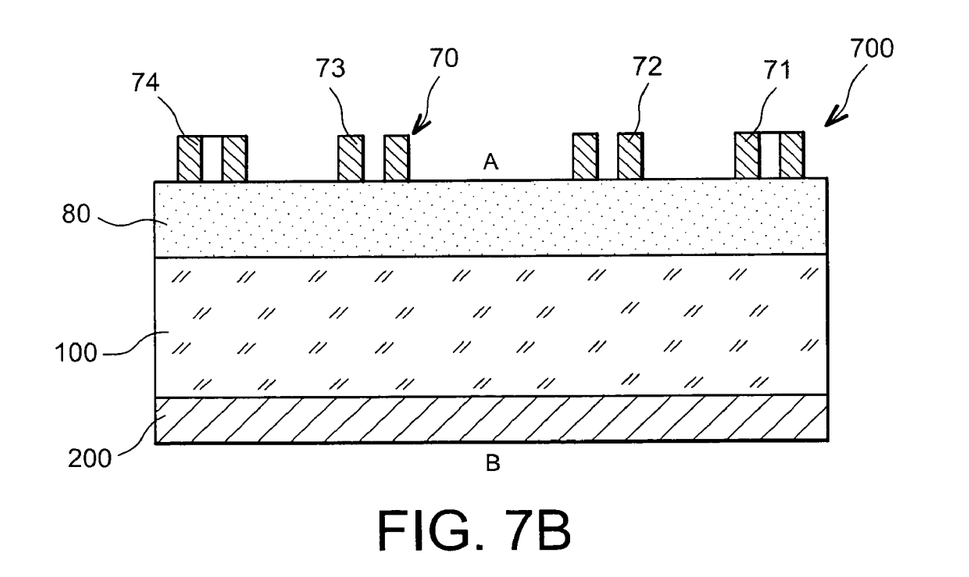

FIGS. 7A and 7B show another embodiment making it possible to eliminate a layer and an interconnection level ("underpass") between the terminals of the conductive element or elements 50 implanted on the upper side of the front surface, and to avoid an interconnection via being provided at this level.

According to the embodiment in FIG. 7A, the first conductive element 70 is formed by a coil 71 to 74 comprising at least one meander 72, 73 constituted by sections of approximately parallel metal tracks here and interconnected alternately, along a path similar to the to and fro movement of a weft yarn shuttle.

The meanders 72 and 73 of the coil produce an inductive or electromagnetic field in the axis A-B transverse to the plane of the coil 70, a field in which the other conductive element 200 of the other surface B of the chip is interposed, which modifies the inductance value of the coil of the first element 70, according to the principle of the invention.

According to the embodiment example in FIGS. 7A and 7B, by implanting such a metal track in a coil 70 of aluminium 5 micrometers thick (5 μm) to form the first conductive element on a substrate chip 100 (or on a passivation layer 80 coating it) of one and a half micrometers square (1300 μm×1100 μm) having the same underlying structure as in the previous example, an inductance variation of about one quarter (25%) is obtained in the event of ablation of the rear earth plane 200.

To advantage, the bigger the surface of the chip 700 occupied by the winding or undulations of the first conductive element and the other conductive element, the more pronounced the inductance variation.

The connections allowing the excitation current to be brought to the terminals 71 and 74 of the coil of the first conductive element 70 and the electrical parameters of this inductance coil 70 to be measured may be implemented through one or two insulation/passivation layers 80 by means of via bringing the contact terminals S, G, D of the transistors T and other elements making up the internal electronic circuit of the chip to the surface.

The advantage of the invention is that the other conductive element 200, arranged on the lower side of the substrate 100 in order to protect the rear surface against tampering or attacks by hackers, does not need to be connected to the internal electronic circuit of the chip.

To advantage, the inductive or electromagnetic coupling between the first element, which protects the front surface, and the other conductive element, which protects the rear surface, is made remotely without contact, which means that the problem posed by the connection between the electronic circuit implanted on the upper surface of the substrate 100 and the lower surface of the chip corresponding to the rear surface B can be avoided.

The chip does not therefore comprise any via provided on the lower side of the rear surface. There is no via passing through the semiconductor substrate 100 with this invention.

According to the principle disclosed previously, the arrangement of a first conductive element 30 or 70 in the form of an inductance coil on the front surface A, on the upper side of the chip, and of another conductive element 200 formed of a metal plated plane on the rear surface of the other side of the substrate 100, makes it possible to obtain an inductive or electromagnetic coupling between the conductive elements of the opposite surfaces A and B.

Different embodiment forms and alternatives are thereby conceivable in constituting the conductive elements of the two surfaces of the integrated circuit according to the invention.

In the embodiments disclosed above, the lower side conductive element is formed by a metal plated plane. A metal plated surface of this kind makes it possible to advantage to form a metal mass in the geometric field, and more exactly in the space in which the inductive field or the electromagnetic field generated by the inductance of the first conductive element is propagated.

The other conductive element therefore forms an earth plane or an equipotential surface which is interposed in the field of the first conductive element.

To advantage, an earth plane of this kind has a resistance which is as low as possible or a maximum or at least particularly high conductance.

According to a proposal put forward to explain the phenomenon at the root of the invention, the excitation of the self-inductance of the first conductive element 30 or 70 induces an electromagnetic field B which brings out a strong current in the low resistance earth plane formed by the other conductive element 200, which is opposed to this field, which is tantamount to reducing the inductance value of the first conductive element 30 or 70.

According to another embodiment, the first conductive element 10 and by extension, the second conductive element 20 may be constituted simply by a circuit loop extending to the surface or in a plane under the upper surface of the chip.

Generally speaking, the first conductive element 10 and the second conductive element 20 may be formed by only one or several conductive tracks, preferably metal and longilinear, extending to the surface or in a plane enclosed under the surface of the housing of the chip. This track or these tracks may be connected at only one of their ends in order to receive the excitation signal.

Thus, according to another alternative, the first conductive element and/or the second conductive element may comprise several track sections arranged approximately parallel and interconnected end to end (as is the case with the coil) or by only one comb-shaped end.

The first conductive element and the second conductive element may thus have alternating, intermingled or intertwined patterns.

The other rear surface conductive element may also assume different shapes in order to fulfil the function of electromagnetic antenna reflector, the screen and/or earth plane function.

The rear surface conductive element may thus have the same pattern or a similar shape to the first conductive element which constitutes the transmit antenna on the first surface.

To constitute a good reflector, the rear surface conductive element preferably has good conductivity or low resistance, like an earth plane.

This rear conductive element may be formed of a conductive armature, or a spiral short-circuited winding, or a short circuited coil, or a short-circuited circuit loop, or a single conductive track or several interconnected parallel metal tracks.

According to other embodiments, the rear surface conductive element 10 is formed by a conductive mesh pattern.

The rear surface conductive element 10 may thus comprise a network of metal meshes with circular or polygonal, and particularly hexagonal or square mesh.

In particular, the rear surface element 10 may be a metal grid, particularly an aluminium grid network deposited on the rear surface of the substrate. The number of meshes in the network may vary from a single mesh (a short-circuited conductive loop) to any number of meshes. The larger the number of meshes, the tighter the mesh and the more it constitutes a protective barrier of enhanced efficiency against tampering by a probe or analysis by X-rays or scanning electron microscope.

Subsequently, other forms, alternatives and embodiments may be implemented by the man skilled in the art, without departing from the scope of the present invention.

The invention claimed is:

1. A single monolithic electronic device comprising:
an integrated circuit chip configured to include informative data having security-sensitive content; and
a data protection device configured to prevent access to said informative data, said protection device including,
a first conductive element connected to the integrated circuit chip, located on a first side of the integrated circuit chip, and
a second conductive element located on a second side of the integrated circuit chip, the second side being opposite to the first side, the first conductive element and the second conductive element being coupled by inductive coupling, the second conductive element not being electrically connected to the integrated circuit chip and the first conductive element.

2. A device according to claim 1, wherein the first conductive element and the second conductive element include alternate intermingled, wound, or intertwined patterns.

3. A device according to claim 1, wherein the first conductive element includes a transmitting armature.

4. A device according to claim 1, wherein at least one of the first conductive element or the second conductive element include an inductance.

5. A device according to claim 1, wherein the second conductive element includes a ground plane conductance or a low resistance.

6. A device according to claim 1, said data protection device further comprising an electromagnetic excitation device for electromagnetic excitation of the first conductive element.

7. A device according to claim 1, said data protection device further comprising:
an inductance measuring device in connection with the first conductive element for measuring an inductance of the first conductive element, and for detecting a variation of the inductance.

8. A device according to claim 7, said data protection device further comprising:
a deletion unit for deleting or ceasing to store data in the integrated circuit chip, if a change of the inductance is detected by the inductance measuring device.

9. A device according to claim 1, wherein the first conductive element is connected to an integrated electronic circuit inside the chip, whereas the second conductive element is not connected to the integrated circuit chip and the first conductive element.

10. A device according to claim 1, wherein the integrated circuit chip includes upper coating layers including at least one metal or conductive level allowing the first conductive element to be connected with an integrated electronic circuit.

11. A device according to claim 1, wherein the second conductive element forms an earth plane or an equipotential.

12. A device according to claim 1, wherein the first conductive element includes at least one longilinear metal track.

13. A device according to claim 1, wherein the first conductive element includes plural interconnected sections arranged in a substantially parallel way so as to form at least one meander or one coil.

14. A device according to claim 1, wherein the second conductive element includes a plane or a metal plated surface portion or a network of conductive meshes, or a network of substantially circular, square, hexagonal or polygonal meshes, or a grid.

15. A device according to claim 1, wherein each conductive element lies in a plane substantially parallel to a side surface of the integrated circuit chip.

16. A device according to claim 1, wherein the conductive elements of the integrated circuit chip are coated with an encapsulation material.

17. A chip card, including at least one electronic device according to claim 1.

18. An encryption or decoding device including one or more electronic devices according to claim 1.

19. A device according to claim 1, wherein the integrated circuit chip is arranged between the first side and the second side of the device.

20. A single monolithic electronic device comprising:
an integrated circuit chip configured to include informative data having security-sensitive content;
a data protection device configured to prevent access to said informative data, said data protection device including,
a first conductive element connected to the integrated circuit chip, located on a first side of the integrated circuit chip, and
a second conductive element located on a second side of the integrated circuit chip, the second side being opposite of the first side, the first conductive element and the second conductive element being coupled by inductive coupling, the second conductive element not being electrically connected to the integrated circuit chip and the first conductive element; and an inductance measuring device in connection with the first conductive element configured to measure an inductance of the first conductive element for detecting a variation of the inductance.

21. A single monolithic electronic device, comprising:

an integrated circuit chip configured to include informative data having security-sensitive content; and a data protection device configured to prevent access to said informative data, said data protection device including, a first conductive element connected to the integrated circuit chip, located on a first side of the integrated circuit chip, and a second conductive element located on a second side of the integrated circuit chip, the second side being opposite of the first side, the first conductive element and the second conductive element being coupled by inductive coupling, the second conductive element not being electrically connected to the integrated circuit chip and the first conductive element;

an inductance measuring device in connection with the first conductive element configured to measure an inductance of the first conductive element, and to detect a variation of the inductance; and a deletion unit configured to delete or cease to store data in the integrated circuit chip, after a change of the inductance is detected by the inductance measuring device.

* * * * *